United States Patent
Yamasaki et al.

(10) Patent No.: US 10,033,253 B2
(45) Date of Patent: Jul. 24, 2018

(54) DRIVE DEVICE

(71) Applicant: DENSO CORPORATION, Kariya, Aichi-pref. (JP)

(72) Inventors: Masashi Yamasaki, Kariya (JP); Hideki Kabune, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 201 days.

(21) Appl. No.: 14/971,315

(22) Filed: Dec. 16, 2015

(65) Prior Publication Data
US 2016/0181883 A1 Jun. 23, 2016

(30) Foreign Application Priority Data
Dec. 22, 2014 (JP) ................................ 2014-258883

(51) Int. Cl.
*H02K 11/30* (2016.01)
*H02K 11/33* (2016.01)
*H05K 7/14* (2006.01)

(52) U.S. Cl.
CPC ............. *H02K 11/33* (2016.01); *H02K 11/30* (2016.01); *H02K 2211/03* (2013.01); *H05K 7/14* (2013.01)

(58) Field of Classification Search
CPC ........................... H01R 12/7064; H01R 12/51
USPC ............................................ 361/740; 439/81
See application file for complete search history.

(56) References Cited

U.S. PATENT DOCUMENTS

| 4,380,359 A * | 4/1983 | Hoffman | H01R 23/68 439/77 |
| 4,797,110 A * | 1/1989 | Ponziani | H01R 4/028 228/180.1 |
| 5,064,379 A * | 11/1991 | Ryll | H01R 12/58 439/81 |
| 5,740,019 A | 4/1998 | Lee | |

(Continued)

FOREIGN PATENT DOCUMENTS

| JP | H3-40695 | 2/1991 |
| JP | H7-212998 | 8/1995 |

(Continued)

OTHER PUBLICATIONS

English Machine Translation of Yoshinaga et al., JP 2007-214085, Aug. 2007.*

(Continued)

*Primary Examiner* — Burton Mullins
(74) *Attorney, Agent, or Firm* — Knobbe, Martens, Olson & Bear, LLP

(57) ABSTRACT

A drive device includes a motor, having a stator on which a winding wire group is wound, a rotor disposed relative to the stator, and a shaft rotating in one body with the rotor are included, a controller disposed on one axial end of the motor and having a substrate on which electronic components for controlling a power supply to the winding wire group are implemented, a frame member facing the substrate and having a substrate supporter that supports the substrate in a contacting manner, a boss protruding from the frame member toward the substrate, and an engager fixedly disposed on the substrate and having elastically-deformable multiple claws that engagingly hold the boss in a binding manner. This arrangement reduces the volume of the drive device.

30 Claims, 9 Drawing Sheets

(56) References Cited

U.S. PATENT DOCUMENTS

| | | | |
|---|---|---|---|
| 6,259,032 B1* | 7/2001 | Fernandez | H01R 4/64 174/138 E |
| 7,581,965 B1* | 9/2009 | Upasani | H05K 3/32 439/82 |
| 8,237,318 B2* | 8/2012 | Ikitake | H05K 7/142 310/156.05 |
| 2007/0133187 A1* | 6/2007 | Lin | H05K 1/0215 361/799 |
| 2011/0254387 A1* | 10/2011 | Matsuda | B62D 5/0406 310/43 |
| 2012/0234856 A1* | 9/2012 | Cannon | H02K 7/116 222/1 |
| 2015/0319839 A1 | 11/2015 | Ichikawa et al. | |

FOREIGN PATENT DOCUMENTS

| | | | | |
|---|---|---|---|---|
| JP | 2000-175403 | | 6/2000 | |
| JP | 2005-86136 A | | 3/2005 | |
| JP | 2007-214085 | * | 8/2007 | ............ H01R 12/04 |
| JP | 2008-305868 A | | 12/2008 | |

OTHER PUBLICATIONS

U.S. Appl. No. 14/812,415, filed Jul. 29, 2015, Yamasaki et al.
U.S. Appl. No. 14/812,733, filed Jul. 29, 2015, Yamasaki et al.
U.S. Appl. No. 14/861,801, filed Sep. 22, 2015, Yamasaki, Masashi.

* cited by examiner

DRIVE DEVICE

CROSS REFERENCE TO RELATED APPLICATION

The present application is based on and claims the benefit of priority of Japanese Patent Application No. 2014-258883, filed on Dec. 22, 2014, the disclosure of which is incorporated herein by reference.

TECHNICAL FIELD

The present disclosure generally relates to a drive device having a motor and a controller.

BACKGROUND INFORMATION

In the drive device, a substrate is conventionally attached to a case by using a screw for fixation of the substrate in the case (e.g., see disclosure of a patent document, Japanese Patent Laid Open No. 2008-305868 (patent document 1)). For example, a drive device provided as a combination of a motor and a controller may have the substrate of the controller which is screw-attached to a frame member.

However, when the substrate is attached to the frame member by a screw, a tool such as a screwdriver must be used, which then necessitates a work space for using the screwdriver or the like and restricts the mounting space of the electronic components on the substrate. As a result, volume reduction of the drive device is prevented in the screw-attached structure of fixedly attaching the substrate to the frame member. Further, the assembly work for the attachment of the substrate to the frame member is required, which increases the number of work steps, when the substrate is attached to the frame member by using a screw.

SUMMARY

It is an object of the present disclosure to provide a drive device in which the substrate is attachable to the frame member without using a tool.

In an aspect of the present disclosure, a drive device includes a motor including a stator on which a winding wire group is wound, a rotor rotatably disposed relative to the stator, and a shaft rotating in one body with the rotor. The drive device also includes a controller disposed on one axial end of the motor and having a substrate on which electronic components for controlling a power supply to a winding wire are implemented. The drive device further includes a frame member facing the substrate and having a substrate supporter that supports the substrate in a contacting manner. The drive device also includes a protrusion protruding from the frame member toward the substrate. The drive device further includes an engager fixedly disposed on the substrate and having a plurality of elastically-deformable claws that engagingly hold the protrusion in a binding manner.

In the above configuration, when the drive device is manufactured, the protrusion protruding from the frame member is pressedly inserted into the engager that is fixedly disposed on the substrate, and the substrate is moved until the substrate supporter contacts the substrate. Then, the plurality of the claws holds the protrusion in the binding manner by elastically contacting the protrusion. When the substrate in a contact state with the substrate supporter has the engager engagingly hold by the protrusion, the substrate is fixedly attached to the frame member.

Therefore, when the drive device of the present disclosure is assembled, the substrate of the drive device is fixedly attached to the frame member without using a tool. When a tool is not used, there is no need to reserve a work space for using the tool, thereby raising the restriction on the implementation space of the electronic components regarding the substrate, and reducing the volume of the drive device. Further, the number of work steps for the assembly of the drive device is reduced.

Further, the drive device of the present disclosure is installable in a small space, thereby preferably applied and used in the electric power steering apparatus.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Hereafter, the drive device in the embodiments of the present disclosure is described based on the drawings. In each of the following embodiments, like numbers represent like parts, and description of the like parts is not repeated.

First Embodiment

A drive device 1 in the first embodiment of the present disclosure is applied to an electric power steering apparatus of a vehicle. The electric power steering apparatus assist a steering operation by a driver of the vehicle by transmitting a steering assist torque which is output from the drive device 1 to a column or a rack via a speed reduction gear.

Figure 9:
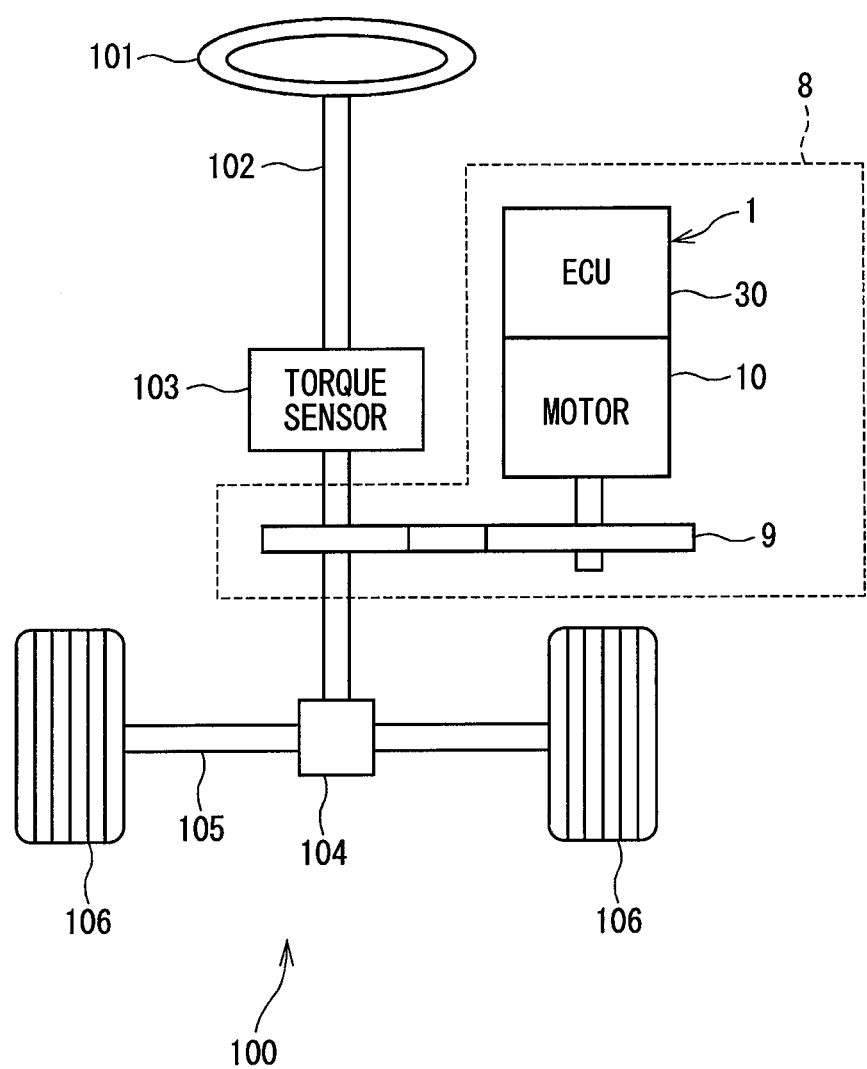
FIG. 9 is an illustration of a steering system including an electric power steering apparatus.

FIG. 9 shows an entire configuration of a steering system 100 having an electric power steering apparatus 8. The steering system 100 includes a steering wheel 101, a column shaft 102, a pinion gear 104, a rack shaft 105, a tire 106, and an electric power steering apparatus 8 as the components.

The steering wheel 101 is connected to the column shaft 102. A torque sensor 103 disposed on the column shaft 102 detects a steering torque generated from the driver operation of the steering wheel 101. The pinion gear 104 is formed at the tip of the column shaft 102, and the pinion gear 104 is engaged with the rack shaft 105. A pair of tires 106 is disposed on both ends of the rack shaft 105 via a tie rod or the like.

Thereby, when the driver rotates the steering wheel 101, the column shaft 102 connected to the steering wheel 101 also rotates. The rotational movement of the column shaft 102 is converted to the translational movement of the rack shaft 105 by the pinion gear 104, and the pair of tires 106 is steered by an angle according to the amount of displacement of the rack shaft 105.

The electric power steering apparatus 8 is provided with a speed reduction gear 9 and the drive device 1.

The drive device 1 includes a motor 10 and a controller 30 (i.e., designated as an "ECU" in FIG. 1), which is required for the control of the motor 10. Both the motor 10 and the controller 30 are combined in one body.

The electric power steering apparatus 8 outputs an assist torque from the motor for assisting a steering of the steering wheel 101 based on the steering torque obtained from a torque sensor 103 and signals from a Controller Area Network (CAN) (not illustrated) regarding the vehicle speed or the like, and transmits the torque to the column shaft 102 via the speed reduction gear 9.

(Drive Device)

Figure 1:
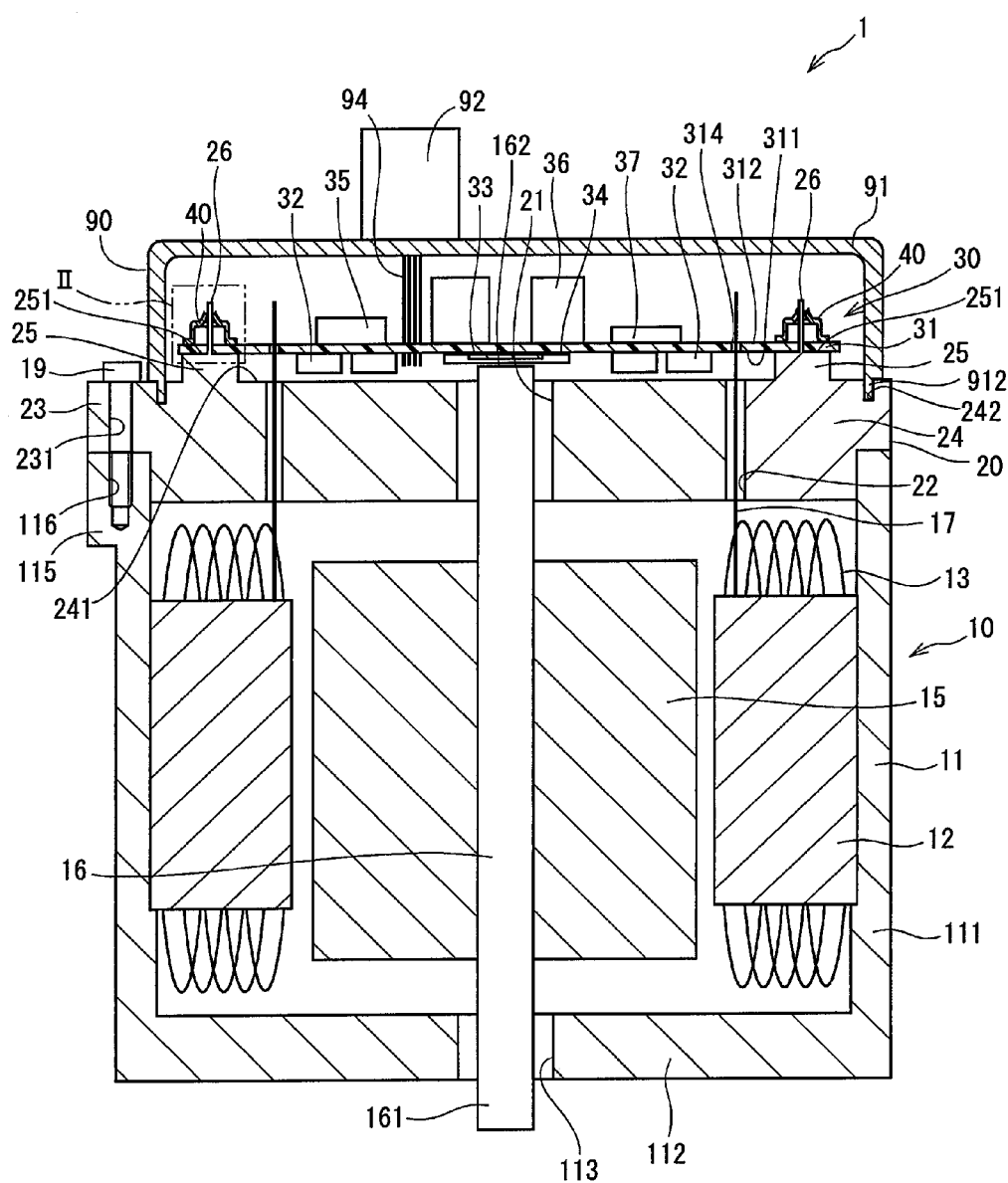
FIG. 1 is a cross-sectional configuration diagram of a drive device in a first embodiment of the present disclosure.

The configuration of the drive device 1 is described with reference to FIG. 1.

The drive device 1 is provided with the motor 10, a frame member 20, a boss 26, the controller 30, an engager 40, a cover member 90 and the like. These components are combined in one body. In the following, the axial direction of the motor 10 may simply be referred to as an "axial direction," and the radius direction of the motor 10 may simply be referred to as a "radius direction."

The motor 10 is a three-phase alternative current electric motor, for example, and is provided with a motor case 11, a stator, two systems of winding wire groups 13, a rotor 15, a shaft 16 and the like.

The motor case 11 is formed in a cylinder shape having a bottom, for example, with metal (e.g. aluminum), and includes a cylinder part 111 and a bottom 112 that is disposed on an opposite end of the cylinder part 111 relative to the controller 30. A shaft hole 113 is bored substantially at the center of the bottom 112, and a bearing (not illustrated) is provided in the shaft hole 113.

In the present embodiment, the frame member 20 functions as a case of the motor 10 together with the motor case 11. The frame member 20 is made with, for example, a thermally conductive metal (e.g. aluminum), and is arranged to cover an opening of the motor case 11. A shaft hole 21 is bored substantially at the center of the frame member 20, and a bearing (not illustrated) is provided in the shaft hole 21. Further, a motor line insertion hole of the frame member 22 is bored on the frame member 20.

The motor case 11 and the frame member 20 respectively have a plurality of fixing parts 115 and 23 which project outwardly along the radius of the motor 10, in a one-to-one corresponding manner. A screw hole 116 is bored on the fixing part 115, and a through hole 231 is bored on a fixing part 23.

When a screw 19 is inserted into the through hole 231 and is screwed into the screw hole 116, the motor case 11 and the frame member 20 are fixedly combined with each other.

In the present embodiment, the motor case 11 and the frame member 20 are electrically connected via contact surfaces on each of the fixing parts 115 and 23. When the screw 19 is conductive, an electric connection between the motor case 11 and the frame member 20 may be established via the screw 19.

The stator 12 is fixedly disposed in an inside of the motor case 11, on which two systems of the winding wire groups 13 are wound. Each of the winding wire groups 13 forms a coil of the three-phase circuit, and a motor line 17 extends from the coil of each phase. The motor line 17 is taken out through the motor line insertion hole of the substrate 22 of the frame member 20 toward the controller 30.

The rotor 15 is disposed in an inside along the radius direction relative to the stator 12, and is coaxially positioned with the stator 12.

The shaft 16 is fixedly disposed at an axial center of the rotor 15. Further, the shaft 16 is rotatably disposed with a support of a bearing on the bottom 112 of the motor case 11 and a bearing on the frame member 20.

One end 161 of the shaft 16 is inserted into the shaft hole 113 on the bottom 112 of the motor case 11, and protrudes to an outside of the motor case 11. An output end of the shaft 16, which is connected to the speed reduction gear 9 of the electric power steering apparatus 8, is provided on the one end 161 of the shaft 16.

A magnet (not illustrated) is held on an other end 162 of the shaft 16. When the other end 162 of the shaft 16 is inserted into the shaft hole 21 of the frame member 20, the magnet faces the controller 30.

The frame member 20 of the present embodiment has, in one body, not only a frame body 24 arranged to cover the opening of the motor case 11 but also a substrate supporter 25.

The substrate supporter 25 is projected toward a substrate 31 from a substrate facing surface 241 of the frame body 24, which faces the substrate 31 of the controller 30. An end surface 251, which is a protruding end of the substrate supporter 25, contacts the substrate 31 in a supporting manner.

By the projection height of the substrate supporter 25, a space is defined between the substrate 31 and the frame body 24. As long as the substrate supporter 25 is capable of supporting the substrate 31, the number of the substrate supporters 25 may be one, or may be more than two.

The boss 26 as a "protrusion" has a rectangular pillar shape, for example, and protrudes from the end surface 251 of the substrate supporter 25 toward the substrate 31.

The boss 26 in the present embodiment is formed in one body with the frame member 20. The boss 26 may be evenly arranged around the shaft 16 (i.e., the axis of the shaft 16), at several positions on the substrate facing surface 241 of the frame body 24.

The controller 30 is provided with the substrate 31 on which various kinds of electronic components are mounted.

The substrate 31 is a printed circuit board, for example, and is perpendicularly positioned relative to the axial direction of the motor 10 to face the frame member 20. One of the two main surfaces of the substrate 31 is designated as a first main surface 311, which faces the frame member 20. The other one of the two main faces of the substrate 31 is designated as a second main face 312.

The first main face 311 of the substrate 31 has, mounted on the first main face 311, a plurality of switching elements 32 (e.g., Metal-Oxide-Semiconductor Field-Effect Transistor (MOSFET)) serving as two inverters that respectively correspond to two systems of the winding wire groups 13, a sensor 33 for detecting a position of the rotor 15, an integrated circuit 34 which outputs to the switch elements 32 a driving signal based on an instruction value and the like.

The sensor 33 faces the magnet held on the other end 162 of the shaft 16. The switch element 32 and the integrated circuit 34 contact, via a heat dissipation gel (not illustrated), the frame member 20 in a heat dissipatable manner. That is, the frame member 20 of the present embodiment functions as a heat sink beside serving as a frame.

The second main face 312 of the substrate 31 has, mounted on the second main face 312, a microcomputer 35 that calculates an instruction value denoting the electric power supplied to each of the winding wire groups 13, based on the position of the rotor 15 or the like, a capacitor 36 that assists the electric power supply to the inverter by storing the electric charge, a choke coil 37 that serves as a filter circuit together with the capacitor 36 for reducing the noise, and the like. The choke coil of the present embodiment is a normal mode coil.

In the present embodiment, these electronic components 32-37 are mounted on one substrate 31. Therefore, in comparison to having two or more substrates 31 in the controller 30, the number of components is reduced, and the volume reduction of the motor 10 is achieved at the same time.

A motor line insertion hole of the substrate 314 is bored on the substrate 31 at a position corresponding to the motor line 17 extending toward the controller 30. The motor line 17 is inserted into the motor line insertion hole of the substrate 314, and is electrically connected to the substrate 31.

Further, the second main face 312 of the substrate 31 has an engager 40 that pinches or binds the boss 26 is fixedly disposed on the substrate 31. The details of the engager 40 are mentioned later. The engager 40 engagingly holds the boss 26 for firmly supporting the substrate 31 on the supporter 25.

The cover member 90 includes a cover body 91 that covers one side (i.e., the second main face 312) of the substrate 31, and a power supply connector 92 that protrudes from the cover body 91 (i.e., protruding away relative to the motor 10) and two signal connectors (not illustrated). The cover body 91 and the power supply connector 92 are formed in one body.

An end part 912 of the cover body 91 is inserted into a channel, or groove 242 that is formed on the substrate facing surface 241 of the frame body 24, and is fixedly attached by adhesives, etc.

The power supply connector 92 has a power supply connector terminal 94 connected to the substrate 31, and the terminal 94 is connectable to a wire harness (not illustrated), which is connected to a battery. The controller 30 is connected to the battery by electrically connecting the power supply connector terminal 94 to the substrate 31.

(Fixation of the Substrate)

Figure 2:
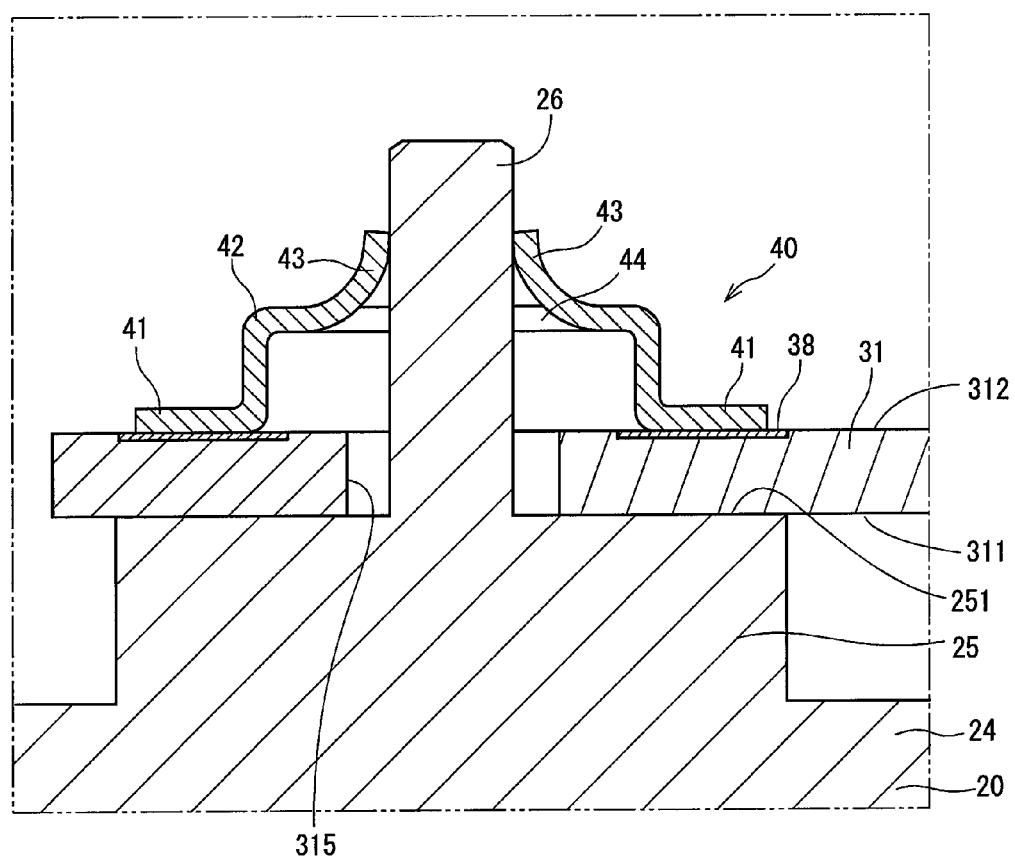
FIG. 2 is an expanded view of a part II in FIG. 1.
Figure 3:
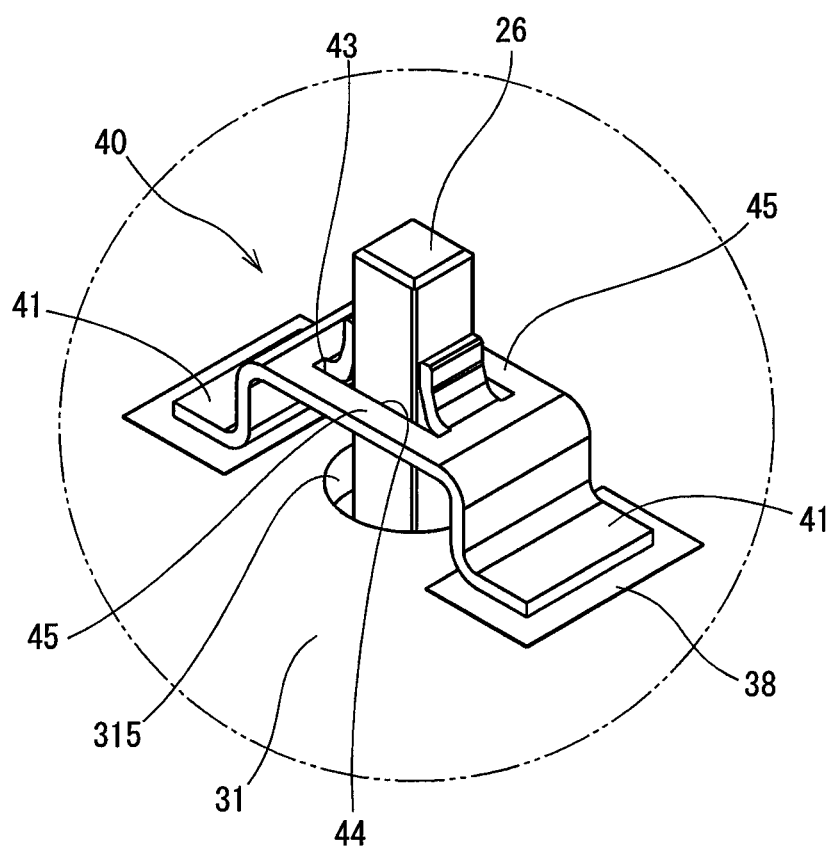
FIG. 3 is a perspective view of a boss and an engager in the first embodiment of the present disclosure.

The fixation structure of the substrate 31, which is a feature of the present embodiment, is described with reference to FIGS. 2 and 3. FIG. 2 is a cross-sectional view of one of multiple bosses 26 and the engager 40 in an expanded manner. FIG. 3 is a perspective view of the boss 26 and the engager 40.

The substrate 31 is fixed to the frame member 20 by using the engager 40. Hereafter, the configuration of the engager 40 is described.

The engager 40 is made with a conductive metal or the like, and has a pair of fixing parts 41, a convex part 42, and a pair of claws 43.

The pair of fixing parts 41 is fixed by being soldered to the substrate 31. Further, the pair of fixing parts 41 are connected to a wiring 38 exposed on the substrate 31, and the wiring 38 is connected to a ground line. That is, the engager 40 is connected to the ground line.

The convex part 42 has a square U shape, and the convex part 42 and the substrate 31 define a space at a position between the pair of fixing parts 41. A boss insertion hole 44 into which the boss 26 of the frame member 20 is inserted is formed on the convex part 42.

The pair of claws 43 respectively extending from the convex part 42 face each other, with the boss insertion hole 44 interposed between the pair of claws 43, and extend away from the substrate 31.

While the pair of claws 43 pinches or binds the boss 26 from both sides by elastically contacting the boss 26, a part of the convex part 42 shown in FIG. 3 (i.e., two periphery parts 45) supports the boss 26 from different sides.

The engager 40 is formed by a metal work (i.e., a cut process and a bend process) of a metal plate, which is elastically bendable. For example, by making an H shape cut on the metal plate, and by bending the cut portion, the pair of claws 43 and the boss insertion hole 44 in between are provided, and the pair of fixing parts 41 and the convex part 42 are formed by bending both ends of the metal plate in a crank shape.

When the substrate 31 is fixed to the frame member 20, while pressing the boss 26 into the engager 40 that is fixed to the substrate 31, the substrate 31 is pressed against the frame member 20 until the substrate 31 contacts the end surface 251 of the substrate supporter 25.

Before the boss 26 is pressed to fit into the engager 40, a gap space between the pair of claws 43 along the arrangement direction of the pair of claws 43 is smaller than a diameter of the boss 26.

When the boss 26 is press-fitted in the engager 40, the boss 26 is inserted into a boss insertion hole 315 on the substrate 31, and then inserted into the insertion hole 44 on the engager 40 in order, and then inserted into a gap between the pair of claws 43. In such manner, the pair of claws 43 are elastically deformed by receiving a pressure from the boss 26, which then elastically bind the boss 26 from both sides by its own elastic force. In such manner, the engager 40 and the boss 26 are firmly connected. Thus, the substrate 31 is firmly fixed to the frame member 20 via the engager 40.

(Effect of the Present Disclosure)

The effects of the drive device 1 in the present embodiment are described in the following.

(1) A drive device in the present embodiment includes a motor including a stator on which a winding wire group is wound, a rotor rotatably disposed relative to the stator, and a shaft rotating in one body with the rotor. The drive device also includes a controller disposed on one axial end of the motor and having a substrate on which electronic components for controlling a power supply to a winding wire are implemented. The drive device further includes a frame member facing the substrate and having a substrate supporter that supports the substrate in a contacting manner. The drive device also includes a protrusion protruding from the frame member toward the substrate. The drive device further includes an engager fixedly disposed on the substrate and having a plurality of elastically-deformable claws that engagingly hold the protrusion in a binding manner.

When manufacturing the drive device 1, while pressing the boss 26 that protrudes from the frame member 20 into the engager 40 that is fixed to the substrate 31 as mentioned above, the substrate 31 is pressed against the frame member 20 until the substrate 31 contacts the substrate supporter 25. In such manner, the plurality of claws 43 bind or pinch the boss 26 by elastically contacting the boss 26. The substrate 31 is fixed to the frame member 20 when the boss 26 is engaged by the engager 40 in a support state in which the substrate 31 contacts the substrate supporter 25.

Therefore, in the present embodiment, the drive device 1 is provided with the following feature (i.e., the substrate 31 used therein is fixable to the frame member 20 without using a tool).

Since there is no need to reserve a work space for handling the tool, the mounting space of the electronic components 32-37 on the substrate 31 is not restricted, thereby enabling a volume reduction of the controller 30 and the drive device 1. Further, the assembly work of manufacturing the drive device 1 is reduced.

Further, the drive device 1 is installable in a small space, and the drive device 1 may preferably be applied to the electric power steering apparatus.

(2) In the present embodiment, the engager 40 is disposed on one side of the substrate 31 (i.e., on the second main face 312 that faces away from the frame member 20). Further, the boss 26 protrudes from the substrate supporter 25, is inserted into the boss insertion hole 315 bored on the substrate 31, and is bound or pinched by the engager 40.

According to the above configuration, the substrate 31 is bound in between the substrate supporter 25 and the engager 40, thereby the substrate 31 is stably fixed.

(3) In the drive device 1 of the present embodiment, a noise is generated by the rotation of the rotor 15, by the switching of the switch element 32, and the like. Here, the noise generated in the drive device 1 is described with reference to FIG. 4.

Figure 4:
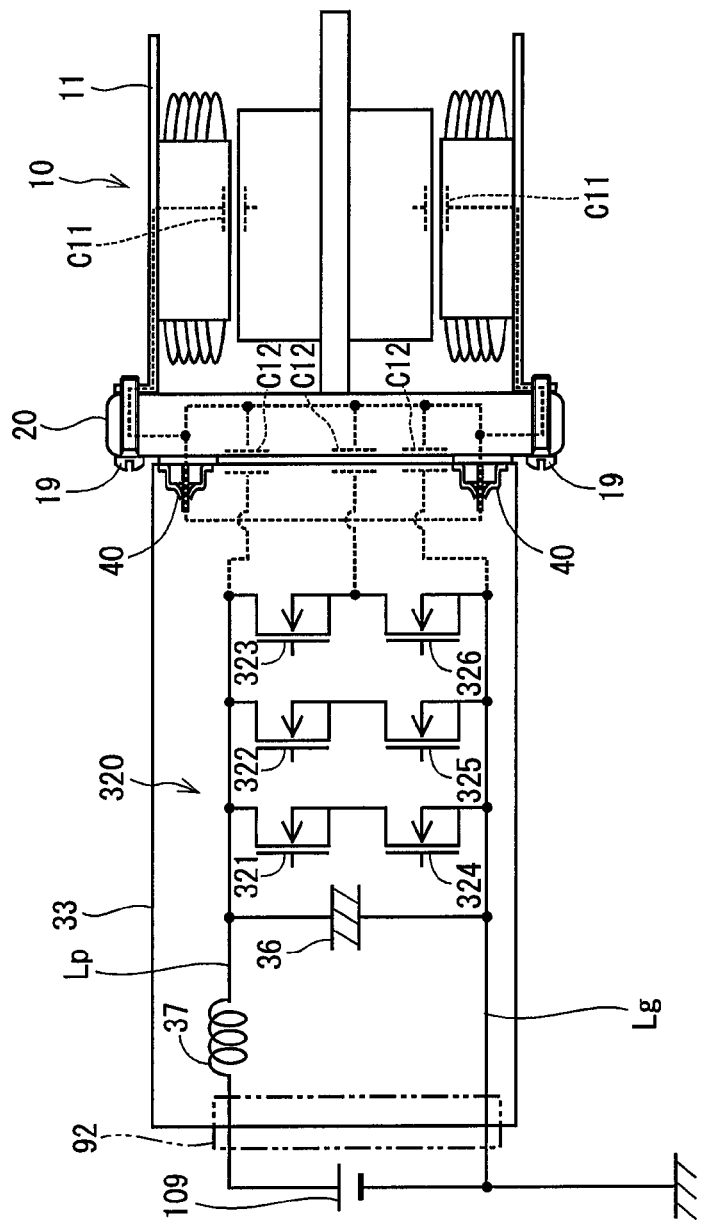
FIG. 4 is an illustration of a noise propagation path in the drive device in the first embodiment of the present disclosure.

FIG. 4 is an illustration, in which a schematic diagram and a cross-sectional view of the drive device 1 are combined, showing electronic components connected to one of two systems of the winding wire groups 13. In FIG. 4, a line which connects the electronic components and the winding wire group 13 is omitted from illustration.

As shown in FIG. 4, a bridge connection of the six switching elements 321-326 is established, to be serving as an inverter 320. The inverter 320 is connected to a negative electrode of a battery 109 via a ground line Lg. The capacitor 36 is connected in parallel on an input side of inverter 320, and the choke coil 37 is connected at a position between the battery 109 and a positive electrode of the capacitor 36.

In FIG. 4, a dashed line shows a propagation path of the noise generated in the drive device 1. The noise may be propagated to the motor case 11 by a stray capacitance C11 between the rotor 15 and the stator 12 or by a stray capacitance C12 between the substrate 31 and the frame member 20, and is further propagated to the battery 109 via the ground of the vehicle body as a common mode noise. Further, when the noise generated in the drive device 1 is propagated to an outside of the driver device 1 (e.g., a vehicle body etc.), the noise may be further propagated to an antenna of the vehicle radio, and may jam the reception of the radio program.

Therefore, in the present embodiment, the engager 40 is made with a conductive material, and is connected to the ground line Lg on the substrate 31, and the frame member 20 is connected to the ground line Lg via the engager 40.

According to such configuration, the above-mentioned stray capacitances C11 and C12 are electrically connected to the ground line Lg. Therefore, the noise generated in the drive device 1 is turned to a normal mode noise, and is reducible by the filter circuit that is formed by the capacitor 36 and the choke coil 37.

Therefore, in the present embodiment, the common mode noise is reduced, thereby simplifying or omitting the counter-measure for the common mode noise. Further, due to the reduction of the noise spilled out from the drive device 1 via the frame member 20, the radio noise resulting from the noise spill from the drive device 1 is reduced.

Second Embodiment

Figure 5:
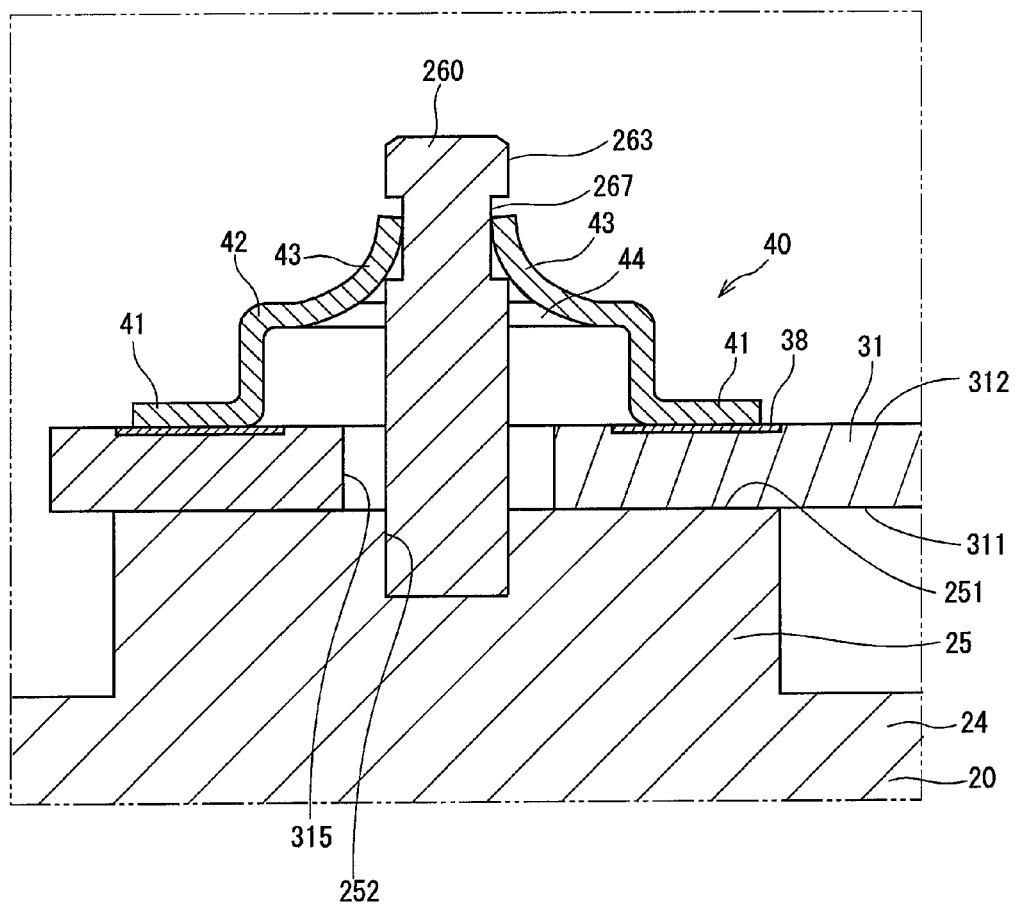
FIG. 5 is a cross-sectional view of the boss and the engager in a second embodiment of the present disclosure.

The drive device in the second embodiment of the present disclosure is described based on FIG. 5. FIG. 5 corresponds to FIG. 2 of the first embodiment.

In the first embodiment, the boss 26 is a part of the frame member 20 (i.e., the boss 26 and the frame member 20 are formed in one body).

In the second embodiment, a boss 260 and the frame member 20 respectively have a separate body. The boss 260 in the second embodiment is, for example, fixed to the substrate supporter 25 by the fitting in a slot 252 that is bored on the substrate supporter 25 of the frame member 20.

Further, in the second embodiment, an indentation, or depression 267 is ditched on a side face 263 of the boss 260, and the claw 43 of the engager 40 engages the depression 267. Therefore, a fall-off of the boss 260 from the engager 40 is prevented. Therefore, the substrate 31 is more securely fixed to the frame member 20.

Further, the boss 260 and the frame member 20 are provided as separate members, thereby making it easier to form the depression 267 on the side face 263 of the boss 260. The effects described in the first embodiment are also achieved.

The depression 267 may be formed on an entire side face 263, or may be formed on a part of the side face 263 (e.g., may be formed at corresponding positions to each of the claws 43).

Third Embodiment

Figure 6:
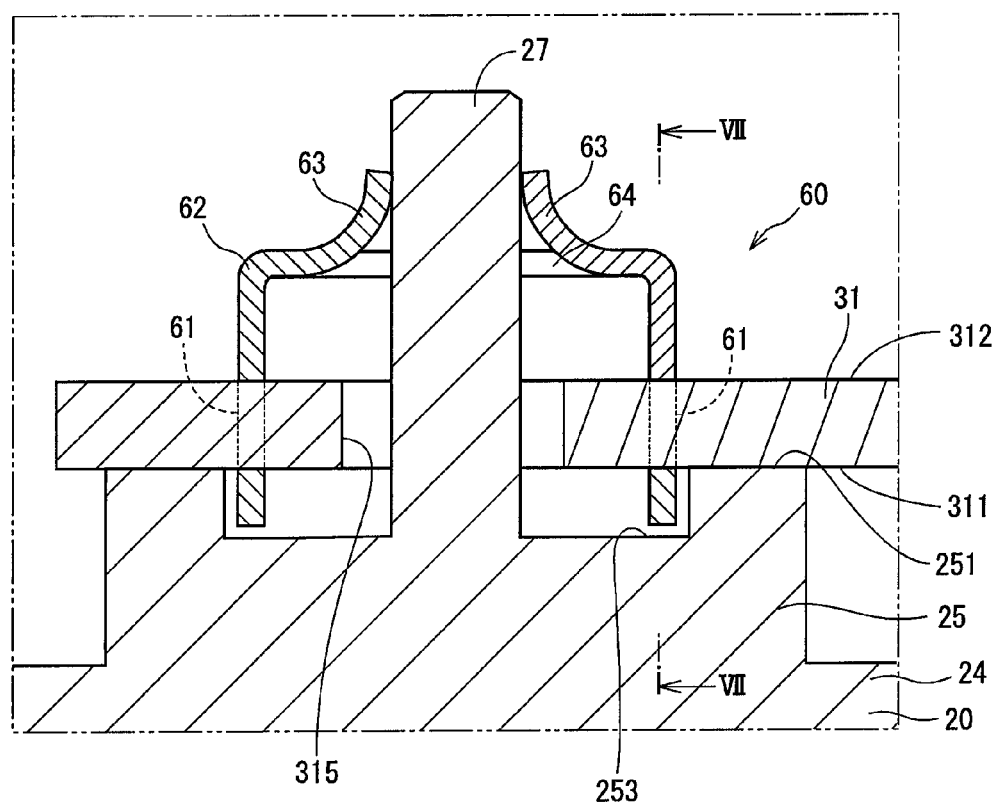
FIG. 6 is a cross-sectional view of the boss and the engager in a third embodiment of the present disclosure.
Figure 7:
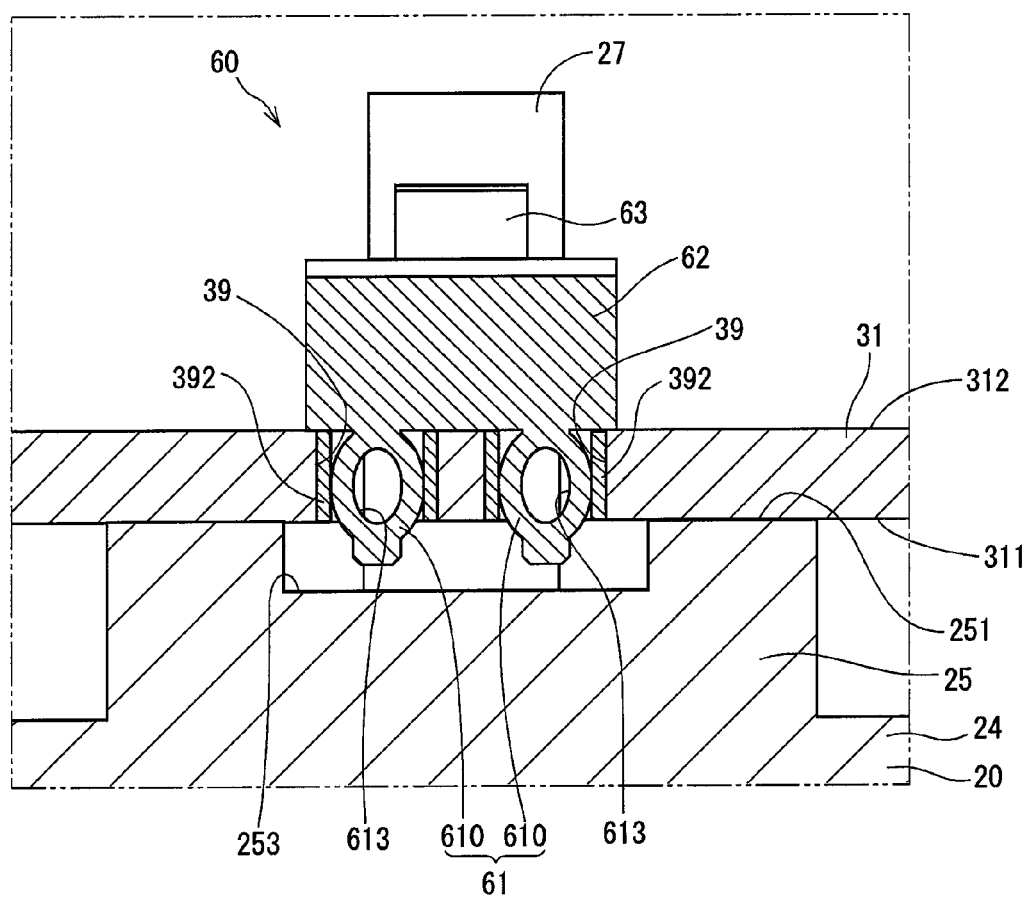
FIG. 7 is a cross-sectional view of the boss and the engager along an arrow VII in FIG. 6.

The drive device in the third embodiment of the present disclosure is described based on FIGS. 6 and 7. FIG. 6 corresponds to FIG. 2 of the first embodiment.

An engager 60 of the third embodiment has a pair of fixing parts 61, a convex part 62, and a pair of claws 63.

The pair of fixing parts 61 comprises two press-fit ends 610, respectively. The press-fit end 610 extends from the convex part 62 to fit in a hole on the substrate 31, and has a through hole 613, which enables an elastic deformation of the press-fit end 610 itself. The configuration of the convex part 62 and the pair of claws 63 is the same as the one in the first embodiment.

On the substrate 31, a through hole 39 having a metal plating 392 formed inside the through hole 39 is bored, which is different from the wiring 38 of the first embodiment. The press-fit end 610 of the engager 60 is press-fitted in the through hole 39.

Further, in the third embodiment, an accommodating groove 253 is formed on the end surface 251 of the substrate supporter 25. The accommodating groove 253 has a concave shape depressed toward the motor 10. The accommodating groove 253 accommodates an edge of the press-fit end 610 of the engager 60.

A boss 27 protrudes from a bottom of the accommodating groove 253 toward the substrate 31, and is pinched or bound by the pair of claws 63.

In the third embodiment, the engager 60 is connected to the substrate 31 by press-fitting, there is no need for the soldering work. Therefore, the assembly work in manufacturing of the drive device 1 is further reduced. The effects described in the first embodiment are also achieved.

Fourth Embodiment

Figure 8:
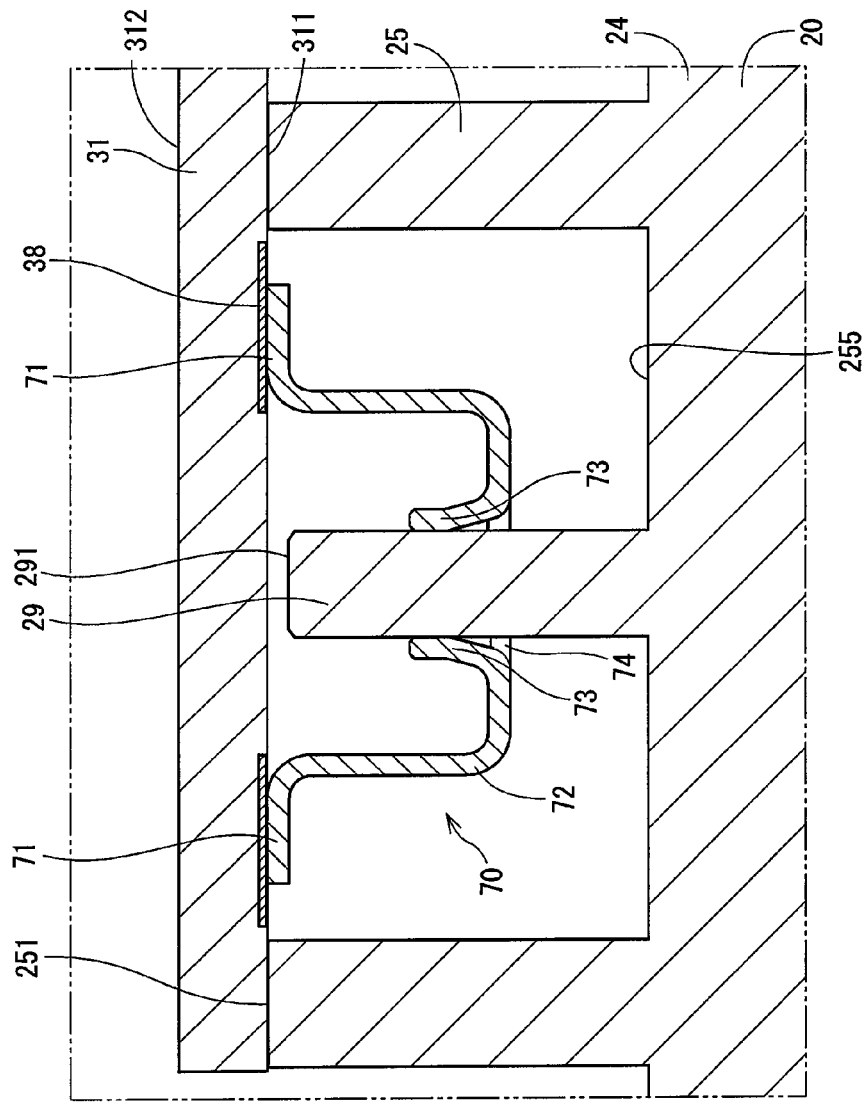
FIG. 8 is a cross-sectional view of the boss and the engager in a fourth embodiment of the present disclosure.

The drive device in the fourth embodiment of the present disclosure is described based on FIG. 8. FIG. 8 corresponds to FIG. 2 of the first embodiment.

In the fourth embodiment, the substrate supporter 25 has a concavity 255 dented toward the motor 10 from the end surface 251. A boss 29 is disposed in an inside of the concavity 255 of the substrate supporter 25. The boss 29 protrudes from a bottom of the concavity 255 toward the substrate 31.

An engager 70 of the fourth embodiment is fixed to the first main face 311 of the substrate 31, and is accommodated in the concavity 255 of the substrate supporter 25.

Further, the engager 70 has a pair of fixing parts 71, a convex part 72, and a pair of claws 73. The pair of claws 73 face each other across an insertion hole 74 of the convex part 72 in between the claws 73, and extend from the convex part 72 toward the substrate 31. That is, the pair of claws 73 extend toward an inner space of the convex part 72. The configuration of the pair of fixing parts 71 and the convex part 72 is the same as the one in the first embodiment.

Unlike the first embodiment, no boss insertion hole is bored on the substrate 31. A boss 29 is press-fitted in the engager 70, without being inserted into the substrate 31. An end face 291 of the boss 29 faces the substrate 31 with a gap reserved to the substrate 31, as shown in FIG. 8.

In the fourth embodiment, no process for boring a boss insertion hole on the substrate 31 is required. Further, when press-fitting the boss 29, the engager 70 receives a press-down force that presses the engager 70 toward the substrate 31, which securely holds the engager 70 on the substrate 31 without causing a fall-off or a separation of the engager 70 from the substrate 31. Further, the effects other than an item (2) in the first embodiment are also achieved.

Other Embodiments

Although the present disclosure has been described in connection with preferred embodiment thereof with reference to the accompanying drawings, it is to be noted that various changes and modifications will become apparent to those skilled in the art.

(a) The structure of the engagers 40, 60, and 70 in the above-mentioned embodiments is just an example, and the engager of the present disclosure is not limited to such configuration, as long as the engager has a claw for holding or binding the boss 26 in an elastically-deformable manner. For example, the plurality of claws 43, 63, and 73 may be provided as separate parts. Further, the number of claws 43, 63, and 73 may be three or more.

(b) In the drive device of other embodiments, a combination of the bosses 26, 27, 29, and 260 and the engagers 40, 60, and 70 may be at least one.

Further, in other embodiments, the configuration of the bosses 26, 27, 29, and 260 of each embodiment may be mixed, and the configuration of the engagers 40, 60, and 70 of each embodiment may be mixed. For example, the bosses 27 and 29 of the third and the fourth embodiment may be configured in the same manner as the boss 260 of the second embodiment. Further, the engager 60 of the third embodiment may be fixed to the first main face 311 of the substrate 31, just like the engager 70 of the fourth embodiment.

(c) In other embodiments, the engagers 40, 60, and 70 needs not be connected to the ground line Lg, and the frame member 20 needs not be conductive to the ground line Lg via the engagers 40, 60, and 70.

(d) The frame member 20 in the above embodiment has the substrate supporter 25 in a protruding shape. However, in other embodiments, the frame member 20 needs not have the substrate supporter 25 in a protruding shape, and the frame body 24 may serve as a "substrate supporter" by supporting the substrate 31 in a contacting manner.

(e) The frame member of the present disclosure may be provided as a part of the casing of the motor 10, as described in the above-mentioned embodiment, or may be provided as a different part from the casing of the motor 10.

(f) In the above-mentioned embodiment, the motor 10 is a three-phase alternative current electric motor. In other embodiments, the motor 10 may be a direct-current motor with a brush, or may be a poly-phase motor of four or more phases. Further, the number of systems of the winding wire groups 13 may be not necessarily two (i.e., may be three or more or may be one).

(g) In the above-mentioned embodiment, the drive device 1 is applied to an electric power steering apparatus. In other embodiments, the drive device 1 may be applied to devices other than an electric power steering apparatus.

Such changes, modifications, and summarized scheme are to be understood as being within the scope of the present disclosure as defined by appended claims.

What is claimed is:

1. A drive device comprising:
   a motor including a stator on which a winding wire group is wound, a rotor rotatably disposed relative to the stator, and a shaft rotatably disposed at an axial center of the rotor;
   a controller disposed on one axial end of the motor and having a substrate with electronic components disposed thereon for controlling a power supply to the winding wire group;
   a frame member facing the substrate and having a substrate supporter that supports the substrate in a contacting manner;
   a protrusion protruding from the frame member toward the substrate; and
   an engager fixedly disposed on the substrate and having a plurality of elastically-deformable claws that engagingly hold the protrusion in a binding manner, wherein
   a side face of the protrusion has a depression formed on the side face to engage with the claw.

2. The drive device of claim 1, wherein
   the engager is made of a conductive material and is connected to a ground line that is disposed on the substrate, and
   the frame member is conductive to the ground line via the engager.

3. The drive device of claim 1, wherein the engager is disposed on an opposite surface relative to a surface that faces the frame member, and
   the protrusion protrudes from the substrate supporter, pierces a hole that is bored on the substrate, and is held by the engager in the binding manner.

4. The drive device of claim 1, wherein the substrate supporter has a concavity having the protrusion formed inside the concavity, and the engager is disposed on one surface of the substrate, the one surface facing the frame member, and the engager is housed in the concavity.

5. The drive device of claim 1, wherein the engager is press-fitted to the substrate to establish a connection with the substrate.

6. The drive device of claim 1, wherein the engager is soldered to the substrate.

7. The drive device of claim 1, wherein the protrusion has a separate body from the frame member.

8. A drive device comprising:
a motor including a stator on which a winding wire group is wound, a rotor rotatably disposed relative to the stator, and a shaft rotatably disposed at an axial center of the rotor;
a controller disposed on one axial end of the motor and having a substrate with electronic components disposed thereon for controlling a power supply to the winding wire group;
a frame member facing the substrate and having a substrate supporter that supports the substrate in a contacting manner;
a protrusion protruding from the frame member toward the substrate; and
an engager fixedly disposed on the substrate and having a plurality of elastically-deformable claws that engagingly hold the protrusion in a binding manner,
wherein the substrate supporter has a concavity having the protrusion formed inside the concavity, and
wherein the engager is disposed on one surface of the substrate, the one surface facing the frame member, and the engager is housed in the concavity.

9. The drive device of claim 8, wherein
the engager is made of a conductive material and is connected to a ground line that is disposed on the substrate, and
the frame member is conductive to the ground line via the engager.

10. The drive device of claim 8, wherein
a side face of the protrusion has a depression formed on the side face to engage with the claw.

11. The drive device of claim 8, wherein
the engager is disposed on an opposite surface relative to a surface that faces the frame member, and
the protrusion protrudes from the substrate supporter, pierces a hole that is bored on the substrate, and is held by the engager in the binding manner.

12. The drive device of claim 8, wherein
the engager is press-fitted to the substrate to establish a connection with the substrate.

13. The drive device of claim 8, wherein
the engager is soldered to the substrate.

14. The drive device of claim 8, wherein
the protrusion has a separate body from the frame member.

15. A drive device comprising:
a motor including a stator on which a winding wire group is wound, a rotor rotatably disposed relative to the stator, and a shaft rotatably disposed at an axial center of the rotor;
a controller disposed on one axial end of the motor and having a substrate with electronic components disposed thereon for controlling a power supply to the winding wire group, the substrate having an edge and a motor line insertion hole bored through the substrate;
a frame member facing the substrate and having a substrate supporter that supports the substrate in a contacting manner, the frame member having a shaft hole bored centrally through the frame member;
a protrusion protruding from the frame member toward the substrate; and
an engager fixedly disposed radially away from the shaft at the edge of the substrate, the engager having a plurality of elastically-deformable claws that engagingly hold the protrusion in a binding manner, wherein;

the shaft extends through the shaft hole, and wherein
the motor line insertion hole is disposed between the shaft and the engager.

16. The drive device of claim 15, wherein
the engager is made of a conductive material and is connected to a ground line that is disposed on the substrate, and
the frame member is conductive to the ground line via the engager.

17. The drive device of claim 15, wherein
a side face of the protrusion has a depression formed on the side face to engage with the claw.

18. The drive device of claim 15, wherein
the engager is disposed on an opposite surface relative to a surface that faces the frame member, and
the protrusion protrudes from the substrate supporter, pierces a boss insertion hole that is bored on the substrate, and is held by the engager in the binding manner.

19. The drive device of claim 15, wherein
the substrate supporter has a concavity having the protrusion formed inside the concavity, and
the engager is disposed on one surface of the substrate, the one surface facing the frame member, and the engager is housed in the concavity.

20. The drive device of claim 15, wherein
the engager is press-fitted to the substrate to establish a connection with the substrate.

21. The drive device of claim 15, wherein
the engager is soldered to the substrate.

22. The drive device of claim 15, wherein
the protrusion has a separate body from the frame member.

23. A drive device comprising:
a motor including a stator on which a winding wire group is wound, a rotor rotatably disposed relative to the stator, and a shaft rotatably disposed at an axial center of the rotor;
a controller disposed on one axial end of the motor and having a substrate with electronic components disposed thereon for controlling a power supply to the winding wire group, the substrate having a frame member facing surface;
a frame member of metal and having a substrate facing surface, the frame member further having a substrate supporter extending axially from the substrate facing surface by an axial length, the substrate supporter configured to contact and support the substrate;
a protrusion protruding from the frame member toward the substrate;
an engager fixedly disposed on the substrate and having a plurality of elastically-deformable claws that engagingly hold the protrusion in a binding manner; and
a space having the axial length of the substrate supporter and bounded between the frame member facing surface and the substrate facing surface, wherein
the space dissipates a heat from the electronic components, and wherein
the frame member dissipates the heat from the electronic components.

24. The drive device of claim 23, wherein
the engager is made of a conductive material and is connected to a ground line that is disposed on the substrate, and
the frame member is conductive to the ground line via the engager.

25. The drive device of claim 23, wherein
a side face of the protrusion has a depression formed on the side face to engage with the claw.

26. The drive device of claim 23, wherein
the engager is disposed on an opposite surface relative to a surface that faces the frame member, and
the protrusion protrudes from the substrate supporter, pierces a hole that is bored on the substrate, and is held by the engager in the binding manner.

27. The drive device of claim 23, wherein
the substrate supporter has a concavity having the protrusion formed inside the concavity, and
the engager is disposed on one surface of the substrate, the one surface facing the frame member, and the engager is housed in the concavity.

28. The drive device of claim 23, wherein
the engager is press-fitted to the substrate to establish a connection with the substrate.

29. The drive device of claim 23, wherein
the engager is soldered to the substrate.

30. The drive device of claim 23, wherein
the protrusion has a separate body from the frame member.

* * * * *